United States Patent [19]

Bildl et al.

[11] Patent Number: 4,588,571

[45] Date of Patent: May 13, 1986

[54] PROCESS FOR THE PURIFICATION OF SILICON BY THE ACTION OF AN ACID

[75] Inventors: Erich Bildl, Post Franking, Austria; Josef Dietl, Neuötting, Fed. Rep. of Germany; Rolf Baueregger, Burgkirchen, Fed. Rep. of Germany; Dieter Seifert, Neuötting, Fed. Rep. of Germany

[73] Assignee: Heliotronic Forschungs-und Entwicklungsgesellschaft fur Solarzellen-Grundstoffe mbH, Burghausen, Fed. Rep. of Germany

[21] Appl. No.: 601,804

[22] Filed: Apr. 19, 1984

[30] Foreign Application Priority Data

May 11, 1983 [DE] Fed. Rep. of Germany ....... 3317286

[51] Int. Cl.$^4$ ............................................. C01B 33/02
[52] U.S. Cl. .................................. 423/348; 134/25.1; 134/25.5
[58] Field of Search ............... 423/348; 134/25.1, 25.5

[56] References Cited

U.S. PATENT DOCUMENTS 2,972,521  2/1961  Voos ................... 423/348
2,973,319  2/1961  Porter ................. 134/25.5
4,304,763  12/1981  Dietl et al. ........... 423/348

FOREIGN PATENT DOCUMENTS 3236276  4/1984  Fed. Rep. of Germany ...... 423/348

Primary Examiner—William R. Dixon, Jr.
Assistant Examiner—Steven Capella
Attorney, Agent, or Firm—Collard, Roe & Galgano

[57] ABSTRACT

A process for the purification of silicon by the action of one or several acids, wherein silicon is established as a stationary phase and one or several acids are caused to form mobile phases for traversing the stationary phase under pressure and absorbing the impurities from the silicon during the passage, leaving behind the silicon with a higher degree of purity.

17 Claims, No Drawings

PROCESS FOR THE PURIFICATION OF SILICON BY THE ACTION OF AN ACID

The invention relates to the purification of silicon by the action of an acid.

An inexpensive generation of current by means of solar cells is only possible, if the base material, silicon, can be made available in sufficiently cheap form. The conventional process for producing high-grade silicon for electronic purposes is therefore not applicable, especially because of the expensive gaseous phase purification steps involved. However, since the purity of so-called "solar silicon" (also called "solar grade silicon" or "terrestrial solar grade silicon") is not required to possess such a high grade, its production may be brought about by cheaper purification methods which frequently include a purification step by the action of an acid.

More particularly, from DE-AS 10 20 008, it is known to use large tanks in which the acid is made to act on the silicon to be purified with vigorous stirring. According to DE-AS 10 27 193, it is known to purify silicon by so-called "heap-leaching", i.e., by intense premixing with diluted hydrochloric acid and subsequent standing for several days. Moreoever, according to CH-PS 567 435, purification is effected by feeding coarse pieces of silicon into the top of a reactor in which a current of acid traverses the reactor in an opposite direction. The silicon falls to the bottom of the reactor and disintegrates due to the action of the acid, gradually forming small pieces which are transported by the acid current to the top and which are then removed from the reactor. Finally, it is known from DE-OS 27 22 783 to also grind silicon during the acid treatment. However, the disadvantages of these known processes are the high expenditure in energy necessary for keeping the silicon particles to be purified in constant movement in the acid solution, the danger of impurities being formed due to abrasion and, in the case of "heap leaching", the long time required by that method.

It is therefore an object of the present invention to provide a process which, contrary to the methods used according to the state of the art, affords a more effective purification of silicon under the action of an acid.

It is a further object of the invention to provide such a purification process which entails a lower expenditure of processing and which is also less time consuming.

It has surprisingly been found that silicon established as a stationary phase can be traversed or passed through under the influence of pressure by mobile flowing phases of acid, without the formation of so-called "nests" or pockets, which do not come into sufficient contact with the acid and thus remain impure. As a consequence, putting the silicon particles in the acid into motion by stirring, grinding, current transportation and the like, as well as intensive mechanical mixing of the silicon and acid, followed by long-time standing, can be abandoned.

The objects of the invention are accomplished by a process in which the silicon to be purified is established as a stationary phase and wherein one or several mobile acid phases traverse the stationary phase by being made to flow therethrough by the exertion of pressure.

The process according to the invention is particularly useful for the purification of crude silicon with a silicon content of more the 95% by weight—so-called "metallurgical grade silicon"—or of pure silicon, which can be obtained, e.g., by recrystallization from metal melts, such as aluminum, usually resulting in a purity of more than 99% by weight of Si. In principle it is also possible to use silicon materials of higher impurity, for instance, alloys, such as FeSi, with a content of 60–90% by weight of Si. For simplicity's sake, in the following, the expression "silicon" will be used for any such suitable silicon base material.

For the purpose of the invention, stationary phases are to be understood to mean layers of silicon particles which are substantially immobile with respect to each other. Such layers can be easily made by depositing silicon particles from suspensions or pastes onto filter faces, e.g., in the form of a filter cake. Useful apparatus are especially filter presses, such as chamber or frame filter presses, but also others in which, by exertion of pressure, a liquid phase can be made to flow through a stationary solid phase, thus, e.g., pressure filter-suction devices, or other pressure filters or appropriately equipped band filters.

The silicon can be used in a wide range of grain sizes, but it should be borne in mind in what manner it will be established as a stationary phase. For instance, with chamber or frame filter presses, which as a rule work well with material capable of being pumped, it will be preferable to use fine grain starting material with a median grain size of from 0.1 to 1000 $\mu$m, preferably 1 to 100 $\mu$m. By "median grain size" it should be understood that at least 50% of the particles have a grain size as indicated or smaller. On the other hand with, e.g., pressure filter-suction devices in which the reaction material will penetrate more easily, large grain silicon may also be used with particle sizes of up to more than 10 mm. With the latter there is the advantage that due to the acid action, which occurs mostly at the grain boundaries, even large silicon pieces will gradually break down to form smaller pieces as the action proceeds.

It is a known fact that impurities accumulate at the boundaries of the grains which, consequently, have to be made accessible to the acid. It is therefore advisable to use, as a rule, silicon particles of median particle size which corresponds at least to the crystallite sizes in the bulk material. However, if the silicon particles are in the range of unfavorable fine dust particles, i.e., below the grain size of about 1 $\mu$m, it is often more advantageous to use coarser grain material, since otherwise the difficulties of manipulation exceed the advantage of better purification.

The desired distribution of grain sizes can be accomplished by milling or grinding the usually large size of coarse grain silicon particles. For that purpose, known fine-crushing machines, e.g., drum mills, vibrating mills or jet mills may be used. The grinding may take place with dry or wet silicon but consideration should be given to the fact that wet ground material is, as a rule, easier to handle and may therefore be, e.g., introduced more readily into a chamber filter-press machine after the grinding is finished.

As mobile acid phase, the known aqueous acids and acid mixtures mentioned above for the purification of silicon are available, for instance, those described in the previously cited patents. More particularly, as oxidizing acids, nitric and sulfuric acid and, as non-oxidizing acids, hydrofluoric and hydrochloric acids are suitable, which may be used singly or in mixture in the known and conventional concentrations and mixing ratios.

Preferably a temperature of from 10° to 90° C., especially 20° to 80° C. is maintained when the acid phase is following through the stationary silicon phase. However, in principle, this temperature may be raised if the apparatus used is adapted to withstand the pressures obtained and required under such conditions.

Experience has shown that, by raising the temperature, the required time for the action of the acids may be considerably shortened. Thus, generally speaking, the purification effect obtained when working at 80° C. for 0.5-2 hours, is comparable to the effect obtained at 20° C. after at least 5-20 hours.

For carrying out the process of the invention, the material to be purified is, as a rule, brought into a pasty condition by the addition of water, or is suspended, and thus made capable of being pumped. The so-prepared mass is then conveyed to the place at which it will function as a stationary phase, for instance, into a chamber filter press or pressure filter-suction device. For effecting transport, diaphragm pumps are especially suitable, because they guarantee a faultless dependable transport of the material. By means of these pumps, the mass may be conveyed, e.g., from a storage vessel through suitable feed lines to the place of operation, where the solid portion is deposited on the faces of the filters, thereby forming the desired stationary phase.

The thickness of the layer to be traversed by the mobile phase is advantageously between 5 to 50 mm, preferably 15 to 35 mm. At smaller thicknesses of the layer, mostly only a low throughput of the silicon processed can be obtained which is no longer economical. With larger thicknesses, on the other hand, the necessary pressure becomes high and this as a rule results in an apparatus of excessive costs of installation and operation.

The surfaces which are contacted by the silicon or the acids are made from materials which are acid resistant and do not possess the property of liberating silicon-doping impurities. Such material are mainly synthetics, such as polytetrafluoroethylene, polypropylene or polyvinylidene fluoride. The filter cloths, too, which, e.g., in chamber filter presses are wrapped around the silicon cake and hold the same, are preferably made of the same materials; it is advisable to choose the pore size in the order of magnitude corresponding to the grains to be held back.

After the silicon to be purified is established as a stationary phase, treatment with the acid can be started. In general, in this operation, not only one, but several different acid phases which complement each other in the purification effect are made to successively flow through the stationary phase. The order in which the acids follow is dependent on the impurities to be removed. For instance, silicon rich in calcium will first be treated with hydrochloric acid and only thereafter with hydrofluoric acid in order to prevent only slightly soluble $CaF_2$ from being formed. Suitable acids, the orders of acids following each other, and mixtures of acids are, however, well known and, e.g., described in the patents previously cited and it is therefore unnecessary to go into further explanation here.

The selected mobile acid phase of any individual case is made to flow through the silicon to be purified by exertion of pressure. In general, the liquid under pressure which is generated, e.g., by pumps or compressors, is fed to the stationary phase over suitable feed lines. At the stationary phase, a pressure gradient is formed, which provides an even distribution and a steady flow-through of the mobile phase, which in its travel becomes enriched with impurities that are removed thereby.

The acid may also be made to flow through the silicon to be purified by the pressure of a gas, e.g., air or an inert gas, such as nitrogen or argon. Another possibility consists of applying suction to the mobile phase to draw it through the stationary phase; this, however, is mostly more expensive.

The ranges of pressure which can be applied are as a rule dependent on the pressure stability of the equipment used-namely, pumps, feed lines, filter presses, etc.; they may be varied within these limits. With the use of chamber filter presses or pressure filter-suction devices good results are obtained, e.g., in the pressure range of 1-16 bar.

It is also advantageous to recycle the mobile phase present in any individual case for an extended time, through the stationary phase.

A particular advantage of the process according to the invention is that the silion present as the stationary phase can in a simple manner in addition to being acted upon successively by different acids, be charged with gases, particularly inert gases, or with water. This affords the possibility, e.g., at the end of any acid treatment step, to press out the acid, for instance by means of a gas, and to rinse the silicon with water to make it free of the previous acid, before the next acid phase is applied. When it is anticipated that, during the acid treatments, the development of a gas flammable in air may take place, which is the case with certain silanes, the entire apparatus may also be made inert by passing through an inert gas, such as nitrogen or argon. After termination of the silicon purification process, it may also be advantageous to subject the silicon to a reaction bonding, by passing diluted NaOH or aqueous ammonia through the apparatus as described in German patent application 32 36 276.5. Finally, the material obtained may be dried by the passage of heated gases therethrough.

After termination of the purfication process, the material obtained and, if desired, after having been washed free of acid and/or having been reaction-bonded and/or dried, will be taken out of the apparatus and further processed. Most of the time, at least one further purification step, usually pyrometallurgical, will follow, examples being melting in combination with vacuum evaporation or treatment with extraction melts. For melting, the reaction-bonded, lumpy material is particularly suitable. Compared with the conventional processes of acid purification, the process according to the invention has the advantage that a number of successive actions and, if desired, after-treatment steps can be carried out, without moving the silicon mechanically, thereby avoiding impurities from being formed by abrasion and also keeping processing expenditure low. This applies especially to the use of the preferred filter presses, particularly the chamber-filter presses which are available as high capacity units, can be operated substantially automatically and, since they do not have movable parts, are easy to service. Moreover, such presses are available with gas-tight features and can therefore be made completely inert.

In the following, the invention will be described more fully in a number of examples which are, however, only given by way of illustration and not of limitation.

EXAMPLE 1

Lumps of crude silicon were pre-crushed by a jaw breaker and a roll crusher, and after having been sorted by means of a gyratory screen, were wet-ground in a vibrating mill. The so-obtained powder had a median grain size of 21 μm, the fine portion with a grain size below 10 μm was 13% and the coarse grain portion with a grain size above 40 μm was 6%. The silicon material to which adhered residual material from the milling process, had the purity shown in Table 1.

60 kg of this silicon powder were suspended in water and the suspension was pumped into a chamber filter press by means of a diaphragm pump (the chamber- and filter-plate materials were made of polyvinylidene fluoride). Pumping continued until the 12 chambers, having a size of 470×470 mm² each, were filled up to a cake height of about 25 mm.

The aqueous mobile phases were admitted under a pressure of 3 bar and they passed through the stationary phase at a throughput of 5 m³/hour. The indicated amounts of liquid were circulated in a cyclical fashion through the filter, the pressure generated by means of a diaphragm pump. The gas used was nitrogen with a gas pressure of 2.5 bar. The acid treatment was performed at room temperature and consisted of the following steps:

First, 240 l of HNO₃ (5% by weight) were pumped during one hour through the stationary silicon phase for prepurification. Subsequently, the acid was removed from the silicon by means of nitrogen and the silicon was further briefly washed with water to free it of any remaining acid. This was followed by a second prepurification lasting for 4 hours with 240 l of HCl (20% by weight) with final removal of the acid by means of nitrogen and a brief washing with water.

For the following main purification, 240 l of a 1:1 mixture of HCl (15% by weight) and HF (2% by weight) were pumped for 12 hours through the silicon. Then the acid was again removed by nitrogen and the remaining acid residue was removed by intensive washing with water. Thereupon, nitrogen was again passed through the silicon, until it was pre-dried to a remaining moisture of about 20% by weight of water.

This product was then wetted with 0.1% aqueous NaOH and the resulting reaction-bonded material was finally dried by passing warm (60° C.) nitrogen therethrough.

The silicon so obtained in the form of plates contained the impurities shown in Table 1.

TABLE 1

| | Purification of crude silicon (indicated values in weight ppm) | | | | | | | | |
|---|---|---|---|---|---|---|---|---|---|
| | Mn | Cr | Cu | Ni | Fe | Al | Ca | Mg | Ti |
| Crude silicon with abraded matter | 300 | 20 | 35 | 100 | 5600 | 3000 | 3000 | 100 | 250 |
| After acid treatment | <2 | <2 | <2 | <2 | 10 | 35 | 10 | <2 | 1.5 |

The plates obtained were subsequently broken into coarse pieces, melted for further purification, and subjected to evaporation in vacuo. After having been cast into blocks, the material so obtained was usable as a base material for the production of solar cells.

EXAMPLE 2

By recrystallization of crude silicon in aluminum, silicon platelets were obtained which, after etching off the superficially adhering aluminum, had the purity shown in Table 2. In order to avoid abrasion from grinding, the platelets were ground in an air-jet mill and yielded a powder having a median grain size of 15 μm (fine portion below 5 μm:10% , coarse portion more than 40 μm:5%). 30 kg of this powder was suspended in water and pumped into a pressure filter-suction device by means of a diaphragm pump, (suction surface 1 m²), so as to form a filter cake having a height of about 30 mm.

At a temperature of 80° C., the liquids were circulated through the filer cake by means of a diaphragm pump at a pressure of 10 bar and a throughput rate of 2.5 m³/hr. The pressure of the nitrogen applied was likewise 10 bar. The following purifying steps were carried out:

prepurifying the silicon filter cake HCl (20% by weight) with 100 l of liquid being passed through for one hour;

blowing off the acid remaining in the silicon cake with nitrogen and washing the silicon cake briefly with water to remove any remaining acid residue;

performing the main purification with a 1:1 mixture of HCl (20% by weight) and HF (5% by weight), 120 l of liquid being made to flow through the filter cake for half an hour;

blowing off the remaining acid to a achieve a residual moisture of 20% and briefly washing with water; and wetting the silicon cake with 5% aqueous ammonia to produce a reaction-bonded product.

Finally, the product was dried with nitrogen at 80° C. The silicon obtained had the purity shown in Table 2.

TABLE 2

| | Purification of recrystallized silicon (indicated values in weight ppm) | | | | | | | | |
|---|---|---|---|---|---|---|---|---|---|
| | Mn | Cr | Cu | Ni | Fe | Al | Ca | Mg | Ti |
| Si platelets after recrystallization | <2 | <2 | <2 | <2 | 6 | 1800 | 70 | 4 | 5 |
| Si after acid treatment | <2 | <2 | <2 | <2 | <2 | 250 | <2 | <2 | <1 |

While only several embodiments and examples of the present invention have been described, it is obvious that many changes and modifications may be made thereunto, without departing from the spirit and scope of the invention.

What is claimed is:

1. In a process for the production of solar grade silicon by purification of silicon of the type including the step of purifying silicon by the action of an acid, the improvement comprising the steps of:
    (a) establishing the silicon to be purified as a stationary phase; and
    (b) establishing at least one acid as a mobile phase and passing said mobile phase under pressure through said stationary phase so that said acid absorbs impurities from the silicon during its passage, leaving behind the silicon in a purer state.

2. The process of claim 1, wherein several mobile acid phases are made to successively pass through the stationary phase so as to, in turn, effect successive stages of purification.

3. The process of claim 2, wherein after the passage of each acid phase and before the next mobile acid phase is passed through the stationary phase, blowing off the acid and silicon by a gas and washing the silicon acid-free with water.

4. The process of claim 1, wherein said acid is selected from the group consisting of hydrochloric acid, hydrofluoric acid, nitric acid, and a mixture thereof.

5. The process of claim 3, wherein said mobile acid phases are repeatedly passed through the stationary phase in a cyclical fashion whereby the acid phases used during the process are recycled through the silicon.

6. The process of claim 1, wherein the silicon to be purified has a median grain size of 1 to 100 μm.

7. The process of claim 1, wherein the passing of the mobile phase through the silicon is carried out at a temperature of 20°-80° C.

8. The process of claim 1, wherein the stationary phase has a thickness of 5-50 mm.

9. The process of claim 1, wherein following step (b), said silicon is subjected to a reaction bonding process comprising the steps of:
    (1) wetting the silicon with a silicon etching agent:
    (2) passing an alkaline agent through the silicon so as to contact the silicon thereby causing the bonding reaction; and
    (3) removing the remaining liquid portion of the reaction at an elevated temperature.

10. The process of claim 1, wherein following step (b) said silicon is subjected to an additional purification step comprising subjecting said silicon to a pyrometallurgical treatment.

11. The process of claim 1, wherein said silicon of step (a) comprises layers of silicon particles.

12. The process of claim 11, additionally including the initial step of producing said layers by depositing silicon particles onto filter faces of a filter press.

13. The process of claim 8, wherein said layers to be traversed by said mobile phase have a thickness of 15-35 mm.

14. The process of claim 9, wherein said alkaline agent in step (2) is a member selected from the group consisting of diluted sodium hydroxide and ammonia.

15. The process of claim 1, wherein:
    said step (a) comprises depositing said silicon to be purified in the form of a filter cake in a filter press; and
    said step (b) comprises pumping at least one acid as a mobile phase through said silicon filter cake by the pressure of a gas.

16. The process of claim 15, wherein a constant volume of said mobile phase is repeatedly passed through the stationary phase in a cyclical fashion whereby said mobile phase in recycled through said silicon.

17. The process of claim 15, wherein said gas in said pumping step is a member selected from the group consisting of air, nitrogen, argon and a combination thereof.

* * * * *